United States Patent
Mannuss et al.

(10) Patent No.: US 12,222,967 B2
(45) Date of Patent: Feb. 11, 2025

(54) GRAPH FRAMEWORK (DATABASE METHODS) TO ANALYZE TRILLION CELL RESERVOIR AND BASIN SIMULATION RESULTS

(71) Applicant: Saudi Arabian Oil Company, Dhahran (SA)

(72) Inventors: Florian Mannuss, Dhahran (SA); Thomas James Byer, Dhahran (SA); Ali H. Dogru, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 17/466,293

(22) Filed: Sep. 3, 2021

(65) Prior Publication Data

US 2022/0075803 A1   Mar. 10, 2022

Related U.S. Application Data

(60) Provisional application No. 63/074,726, filed on Sep. 4, 2020.

(51) Int. Cl.
*G06F 16/28* (2019.01)
*E21B 41/00* (2006.01)
(Continued)

(52) U.S. Cl.
CPC ............ *G06F 16/285* (2019.01); *E21B 41/00* (2013.01); *G06F 16/245* (2019.01);
(Continued)

(58) Field of Classification Search
None
See application file for complete search history.

(56) References Cited

U.S. PATENT DOCUMENTS

| 8,307,289 B2 | 11/2012 | Shah et al. |
| 2003/0088860 A1* | 5/2003 | Wang ................. G06F 8/443 717/153 |

(Continued)

FOREIGN PATENT DOCUMENTS

AU   2015247639   10/2015

OTHER PUBLICATIONS

Yuanlin Jiang; Techniques for Modeling Complex reservoirs and advanced wells; Stanford; Dec. 2007; pp. 1-220.*

(Continued)

*Primary Examiner* — Mariela Reyes
*Assistant Examiner* — Jermaine A Mincey
(74) *Attorney, Agent, or Firm* — Fish & Richardson P.C.

(57) ABSTRACT

Systems and methods include a computer-implemented method for generating and using a graph/document structure to store reservoir simulation results. A graph is generated that represents reservoir simulation results of a reservoir simulation performed on a reservoir using a reservoir simulation model. The graph represents a full set of relational data and non-relational data included in the reservoir simulation results. The graph stores graph information and relational data in a graph/document structure. Objects of the reservoir, elements of the reservoir simulation results, and inputs of the reservoir simulation model are represented as vertices in the graph. Relationships between vertices are represented as edges in the graph. An edge is defined by a pair of vertices in the graph.

23 Claims, 5 Drawing Sheets

(51) Int. Cl.
  *G06F 16/245* (2019.01)
  *G06F 16/901* (2019.01)
  *G06F 30/20* (2020.01)

(52) U.S. Cl.
  CPC .......... *G06F 16/9024* (2019.01); *G06F 30/20* (2020.01); *E21B 2200/20* (2020.05)

(56) References Cited

U.S. PATENT DOCUMENTS

| | | | | |
|---|---|---|---|---|
| 2005/0273303 | A1* | 12/2005 | Flandrin | G06T 17/20 |
| | | | | 703/10 |
| 2008/0235280 | A1* | 9/2008 | Schoen | G06F 16/20 |
| 2010/0299125 | A1* | 11/2010 | Ding | E21B 43/12 |
| | | | | 703/10 |
| 2011/0313745 | A1* | 12/2011 | Mezghani | G06T 17/05 |
| | | | | 703/10 |
| 2015/0066372 | A1* | 3/2015 | Shi | G01N 15/0826 |
| | | | | 702/12 |
| 2016/0306896 | A1 | 10/2016 | Paradies et al. | |
| 2018/0341650 | A1 | 11/2018 | Faith et al. | |
| 2020/0192988 | A1 | 6/2020 | Baddourah et al. | |
| 2020/0226156 | A1 | 7/2020 | Borra et al. | |
| 2020/0371262 | A1 | 11/2020 | McClure | |

OTHER PUBLICATIONS

Codd et al., "A relational model of data for large shared data banks," Communications of the ACM, 1970, 13(6):377-387, 10 pages.

Rodriguez et al., "A path algebra for multi-relational graphs," Proceedings of the 27th International Conference on Data Engineering, ICDE, Apr. 2011, pp. 128-131, 4 pages.

Rodriguez, "The Gremlin Graph Traversal Machine and Language," Proceedings of the ACM Database Programming Languages Conference, Oct. 2015, 10 pages.

Houshmand et al., "Grafs: Graph analytics fusion and synthesis," Cornell University Library, May 2020, 26 pages.

PCT International Search Report and Written Opinion in International Appln. No. PCT/US2021/049073, dated Dec. 3, 2021, 17 pages.

* cited by examiner

GRAPH FRAMEWORK (DATABASE METHODS) TO ANALYZE TRILLION CELL RESERVOIR AND BASIN SIMULATION RESULTS

CROSS-REFERENCE TO RELATED APPLICATIONS

This application is a conversion of Provisional Application No. 63/074,726, filed on Sep. 4, 2020, and is hereby incorporated by reference in its entirety.

BACKGROUND

The present disclosure applies to techniques for analyzing, presenting, and querying large data-sets.

Reservoir and basin simulations can produce a wide variety of different data. Conventional systems for handling and analyzing the data typically use multiple applications for information visualization, three-dimensional (3D) visualization, and analytics. For example, commercial analytics tools typically may only provide relational database storage and non-3D data integration.

SUMMARY

The present disclosure describes techniques that can be used to provide a graph framework (including database methods) to analyze and query large data sets, for example, trillion-cell reservoir and basin simulation results. In some implementations, a computer-implemented method includes the following. A graph is generated that represents reservoir simulation results of a reservoir simulation performed on a reservoir using a reservoir simulation model. The graph represents a full set of relational data and non-relational data included in the reservoir simulation results. The graph stores graph information and relational data in a graph/document structure. Objects of the reservoir, elements of the reservoir simulation results, and inputs of the reservoir simulation model are represented as vertices in the graph. Relationships between vertices are represented as edges in the graph. An edge is defined by a pair of vertices in the graph.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method/the instructions stored on the non-transitory, computer-readable medium.

The subject matter described in this specification can be implemented in particular implementations, so as to realize one or more of the following advantages. First, data layouts used in the present disclosure allows for the development of an analytics and visualization application that integrates information visualization, three-dimensional (3D) visualization, and analytics in a single workflow. By comparison, in conventional systems, those aspects are handled by multiple applications. Second, the present disclosure describes a hybrid graph/document (relational) data layout with a functional query language for arbitrary data queries. Third, hybrid graph/document storage strategies of the present disclosure can avoid the need to press (or incorporate) a graph structure into a relational database model, while preserving the document approach where useful. Also, the 3D data integration allows for the development of workflows and user interfaces that allow a user to integrate information visualization, 3D rendering, and analytics in a single application.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

Like reference numbers and designations in the various drawings indicate like elements.

DETAILED DESCRIPTION

Figure 1:
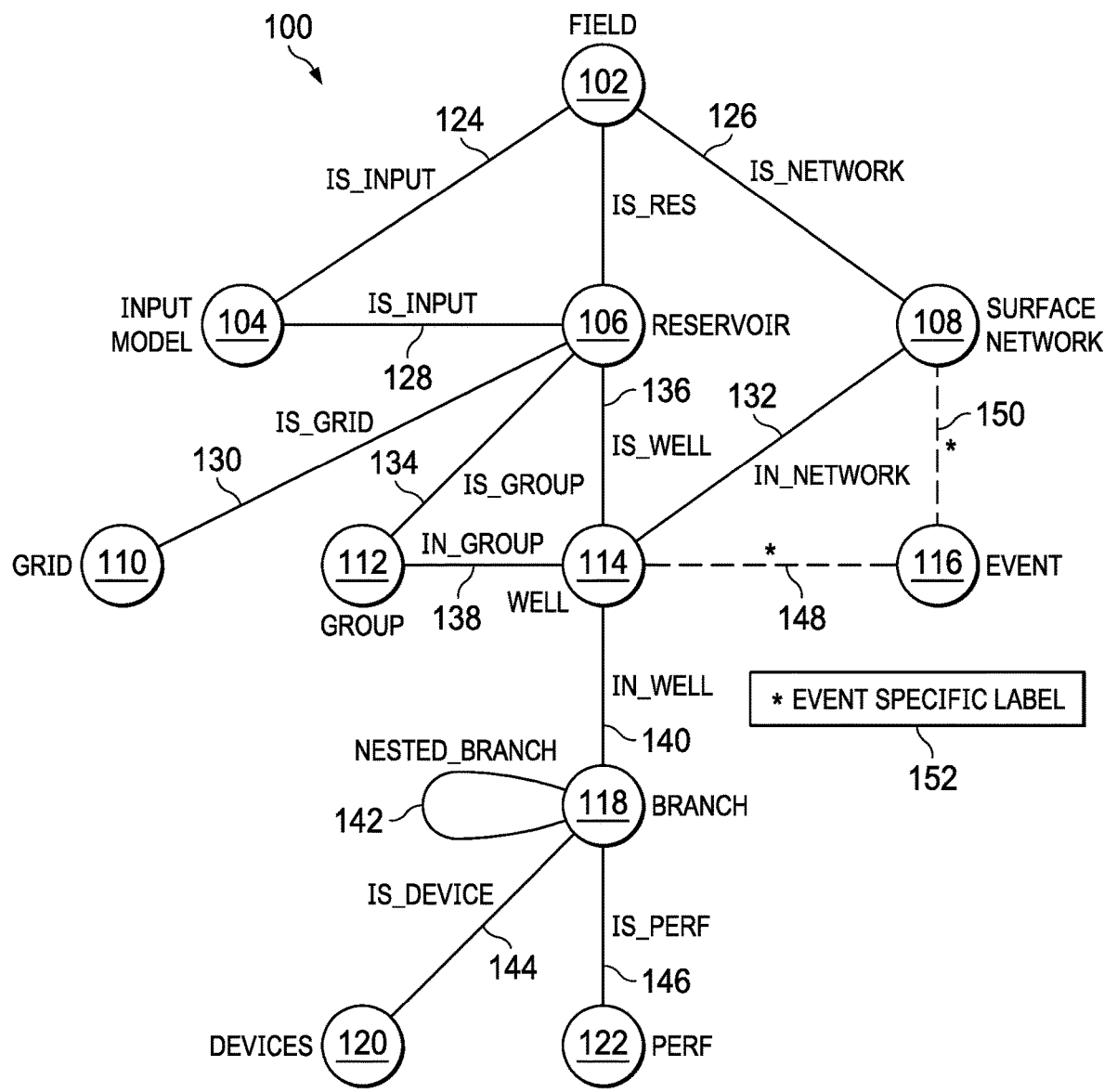
FIG. 1 is a graph showing an example of an actual graph scheme used to describe reservoir simulation results, according to some implementations of the present disclosure.

The following detailed description describes techniques that can be used to provide a graph framework (including database methods) to analyze and query large data sets, for example, trillion-cell reservoir and basin simulation results. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

Reservoir and basin simulations can produce a wide variety of different data. The different data can be divided into time-varying scalar data and time-varying volumetric data that, when used together, describe the simulation grid and its properties. Scalar data describes, for example, the simulated production data of wells in the simulation model. Wells themselves can be composed of different branches. Through field management rules, wells can be dynamically added to different groups throughout the simulation. The connectivity, including how those individual data sets are interconnected, can be described using a generic graph structure.

The present disclosure describes techniques for using a graph structure to describe the connectivity and store all simulation results as applied to reservoir/basin simulation data. The graph structure can be used to analyze the simulation results for use in decision-making. A query language can be used to extract data from the graph and to perform mathematical operations on the data. A corresponding generic graph structure and query language can serve as a base building block to support user interactions, data visualization, and analytics workflows.

For post-processing reservoir and basin simulation, data graph structures can be used to store the data (including the data's relationships), to perform operations on the data, and to filter the data. Reservoir simulation result data sets can include data in a variety of different spatial dimensions and temporal resolutions. For example, a simulation grid is a static volumetric three-dimensional (3D) model with per-cell attributes. Grid attributes can be either static or dynamic. Static attributes do not vary through time. Well, Group, and Field simulation data are temporal scalar values. Groups can refer to a collection of wells. The groups can be either static or dynamic throughout the simulation. Dynamic group memberships can be controlled, for example, through field management rules. As such, group membership of wells can change over time. Field management rules can be used a source for events. Events describe changes in the simulator state as, for example, "drill new well" or "close well ABC." Another sources of events are of algorithmic nature and can describe, for example, changes in solver strategies. Events are an important element used to understand simulation results.

Basin simulation does not include wells, but the corresponding simulation grid changes through time, and information on accumulation bodies is stored. Those accumulation bodies change through time and describe oil and gas accumulations within the simulation grid.

Both simulation outputs naturally form a graph structure. This is true especially for reservoir simulation results, as depicted in FIG. 1. Using a graph as a base data structure is a natural choice. The approach described in the present disclosure includes creating a mixed in-memory database with a generic graph as its base and relational tables or key/value pairs as data elements. Using an in-memory mixed graph/relational database for reservoir/basin simulation post-processing is a unique generic approach that provides the opportunity to integrate arbitrary data sources, which is useful for data post-processing in the future.

A single relational graph is defined as G=(V, E) where E=(i, j) are edges connecting vertices i and j with i, j∈V. In general, E⊆(V×V). In a single relational graph, edges can only be identified through the vertices they connect. This notion can be extended by a multi-relational graph such that E⊆(V×Ω×V) becomes a ternary relationship, with Ω describing a set of edge labels (as a classification). In the reservoir simulation case, a Field vertex can connect to a Grid, Well, or Group vertex. Using a single relational graph, those edges cannot be distinguished. In a multi-relational graph, Ω allows for the identification of those different edge types and provides fast edge label filtering. An example of a label is set Ω={'is_grid', 'is_network', 'in_group', . . . }, as shown in FIG. 1, including edges 130 and 138, for example.

In the case of the group membership of a well, the multi-relational graph model is not sufficient, as the temporal component is missing as a crucial descriptive part. Extending the edge description for time leads to E⊆(V×Ω×T*×V), with T∈{t|$t_{start}$≤t≤$t_{end}$}. In this relationship, $t_{start}$ and $t_{end}$ are the simulation begin and end dates, respectively, and T* is a Kleene star operation allowing an edge to have multiple time values or none. Vertices in this case do not have a time value indicating their validity. Vertices, for example representing wells, are static entities. Only the relationships between the wells are dynamic.

FIG. 1 is a graph showing an example of an actual graph scheme 100 used to describe reservoir simulation results, according to some implementations of the present disclosure. Circles are used to represent vertices 102 through 122, and the names of the vertices are vertex labels. Names of vertex labels can include, for example, Field, Input Model, Reservoir, Surface Network, Grid, Group, Well, Event, Branch, Devices, and Perf (perforation). Lines connecting vertices are edges 124-150, and the names are the edge labels belonging to the edge set Ω. In the graph, for example, a Well (for example, a vertex) can be part (represented by an Edge) of a Group (for example, a Vertex). Edges 148 and 150 can have event specific labels, as indicated by key 152.

The relationships that exist at a given point in time are decided, for example, through simulations field management. Event vertices can be connected to other vertices that include Field, Reservoir, Surface Network, Well, Branch, Perf, and Group vertices. FIG. 1 only shows examples of connections within a Well and Surface Network. Edge labels for edges connecting to an Event vertex are dynamic and depend on the type of event. This graph scheme is only a snapshot of the current situation. As new features are added to the simulator, the simulator's output will change, and as a consequence, the graph scheme will also change.

In a graph database, data is stored as properties using key/value pairs. Additionally, λ: ((V∪E)×Σ*)→(U\(V∪E)) maps an element/string pair to some data value in the universal set U, excluding all vertices and edges. The graph definition can be extended to G=(V, E, λ). Those key/value pairs can describe scalar data values, such as well properties. However, the key/value pairs are insufficient to describe tabular data, as well production rates or grid properties, in the domain of the current example. The pure graph structure has to be extended to be able to handle multi-model datasets.

An approach of the present disclosure can include merging key/value pairs and the relational data layout into a one-document approach. The approach can enforce the constraint that a document can either be a collection of key/value pairs or follow a relational data layout. Documents are also typically always attached to vertices or edges in the graph. However, a vertex or an edge can store multiple documents that are identified by name.

Documents are organized in columns that are named and are accessed by those column names. In the case of key/value pairs, the column names represent the key, and the values can be any data type. Column names for a relational document describe the sets $S_1$, $S_2$, . . . $S_n$ on which the relationship $R_S$⊆($S_1$×$S_2$× . . . ×$S_n$) is based. For a relational document, a primary key set $S_{PK}$, that is independent of $S_1$, $S_2$, $S_n$, can be specified. R=$S_{PK}$×$R_S$ (for example, see equation 216 in FIG. 2) describes the relational document. In the terminology of the present disclosure, this primary key is an independent axis corresponding, for example, to a timestamp or an integer value.

Figure 2:
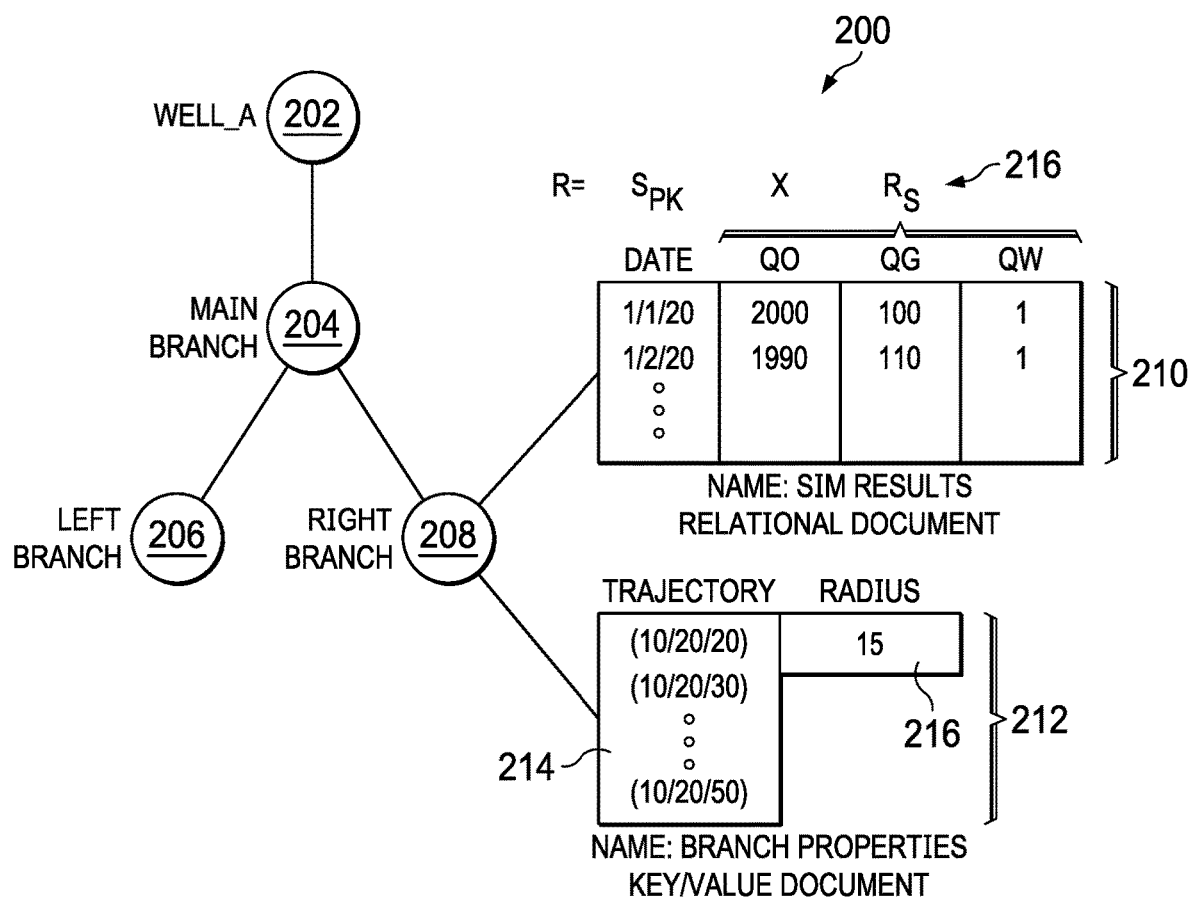
FIG. 2 is a graph-and-table diagram showing examples of data types, according to some implementations of the present disclosure.

An example of adding two documents to a vertex (for example, graph vertex 208) and in which those documents are of different types (relational and key/value document, for example, "Sim Results" table 210 and "Branch Properties" table 212) is shown in FIG. 2. The relational documents illustrate the composition of R using the primary key $S_{PK}$ (independent axis) and $R_S$. Data is accessed by name. In a key/value document, the name is the key, and in relational documents, the name is the column name.

In addition to using base numerical or string values, valid predefined data types for documents can be defined. The definitions can be tuples of numerical values and 1/2/3D vectors of the base numerical and string types, as well as tuple types.

FIG. 2 is a graph-and-table diagram 200 showing examples of data types, according to some implementations of the present disclosure. The graph-and-table diagram 200 includes graph vertices 202-208 and tables 210 and 212. Relational documents are composed of vector types, and key/value documents can freely use required data types. For example, a Trajectory column 214 in table 212 can use a one-dimensional (1D) vector of tuples, and a Radius column 216 can use a numerical scalar value. Grid data and its properties can be stored as 3D vectors, forming a data volume of either tuples for grid coordinates or scalar values for attributes. The "Sim results" table 210 can have a data source (for example, simulation output files 304) using input data (for example, from a file 306). The "Branch Properties" table 212 can have a data source (for example, simulation output files 308) using input data (for example, from a file 310).

This approach can be described as mixing two data models together. As a result, this approach is different from conventional techniques that include multi-model databases in which different storage paradigms, such as graphs, relational data, and JavaScript Object Notation (JSON) datasets, coexist. In conventional approaches, data is stored using the most appropriate available data model. In the current disclosure, which includes techniques for mixing graph and relational models together, the base storage structure is always a graph that embeds key/value pairs or relational data.

Billion-cell data-sets are already too big to keep in memory, and for trillion-cell data-sets, this limitation is even more applicable. Only parts of the data can be loaded into main memory at one time. In order to allow interactive post-processing workflows, data that is needed for visualization has to be loaded in an efficient way. Gathering data and constructing the graph structure can be done through special data source classes. Data sources can be seen as data importers that load data from different data sources. The data importers can also be used to perform operations on the graph, such as calculations and filter and join queries (see FIG. 3). Each data source can control, and decide on-the-fly, whether data is to be loaded in total or on demand.

Figure 3:
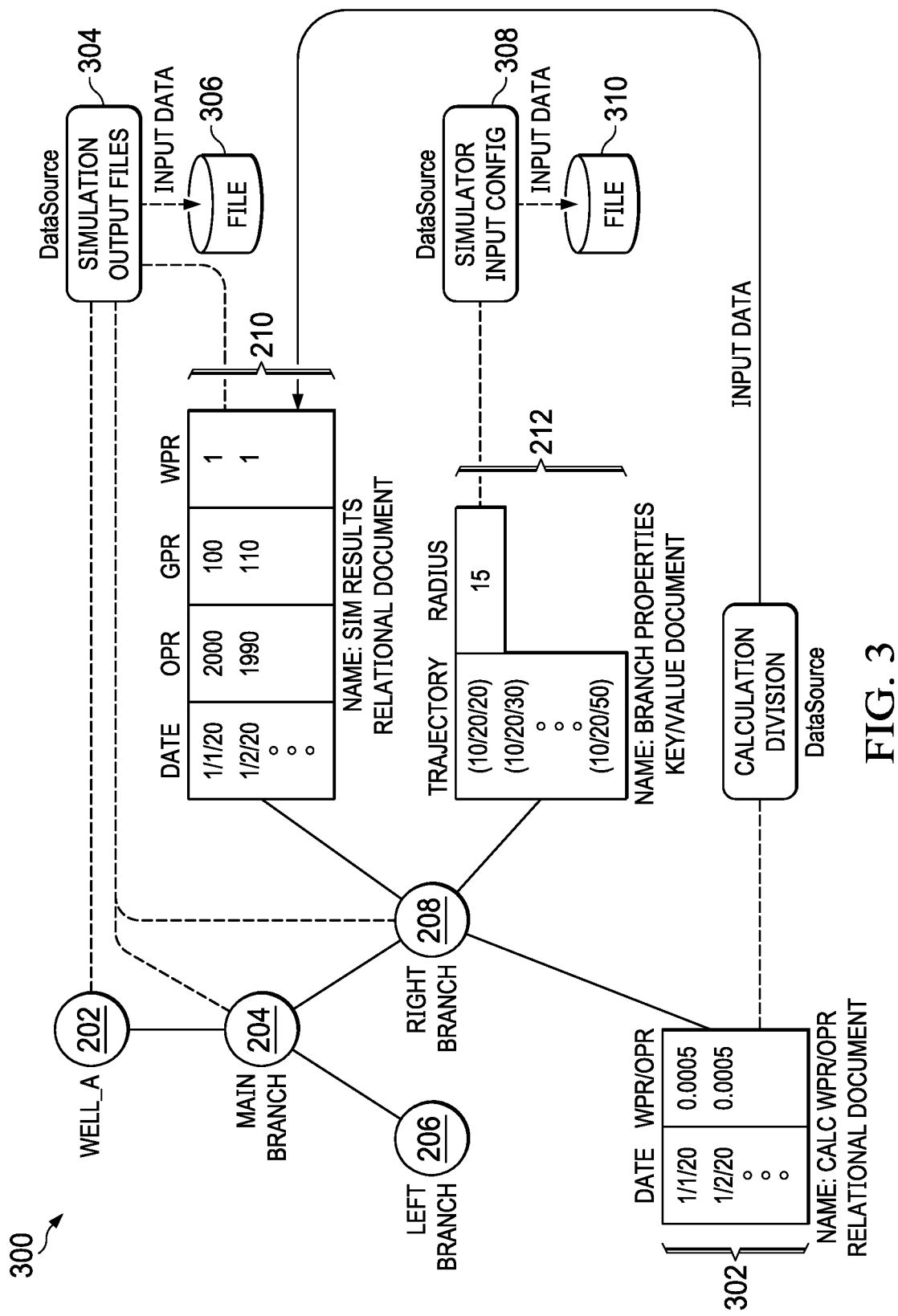
FIG. 3 is a graph-and-table diagram showing an example of a main input data source, according to some implementations of the present disclosure.

FIG. 3 is a graph-and-table diagram 300 showing an example of a main input data source, according to some implementations of the present disclosure. As shown in FIG. 3, data is loaded from either a file or a database. Other data sources shown include calculation operations. In this example, the data for the operation is another document, and as a consequence, the data sources themselves form a call graph.

Another data source in addition to file/database input and calculations includes queries. Queries can include filter operations such as "filter all table document rows where 'OPR'>1990" and storing the result in another table document. This new document can then be used, for example, as input to a calculation operation (for example, resulting in table 302). Queries that serve as data sources can also include joins. As an example, one possible join query can be to first select all perforation locations and use those locations to filter the grid properties at those locations.

Data sources have their own configuration. For input data sources, this can be a file name or a data base connection. In the case of a calculation, the configuration can include the input documents and other parameters. Filter queries also include the documents to filter and the filter ranges. Query data sources can store the documents that are queried and how the documents are joined. The configuration for each data source can be expected to provide all information to allow lazy evaluation.

Data stored in the files or databases used for input data sources is typically much bigger than available main memory all data sources have, preventing the data sources from providing the functionality to unload data. This is needed in case memory is running low and data has to be discarded.

Data view objects are used to instruct a data source what data is needed. As such, data view objects describe the usage intent of the data. Based on this description, the data source has to choose the appropriate method to retrieve the data.

Figure 4:
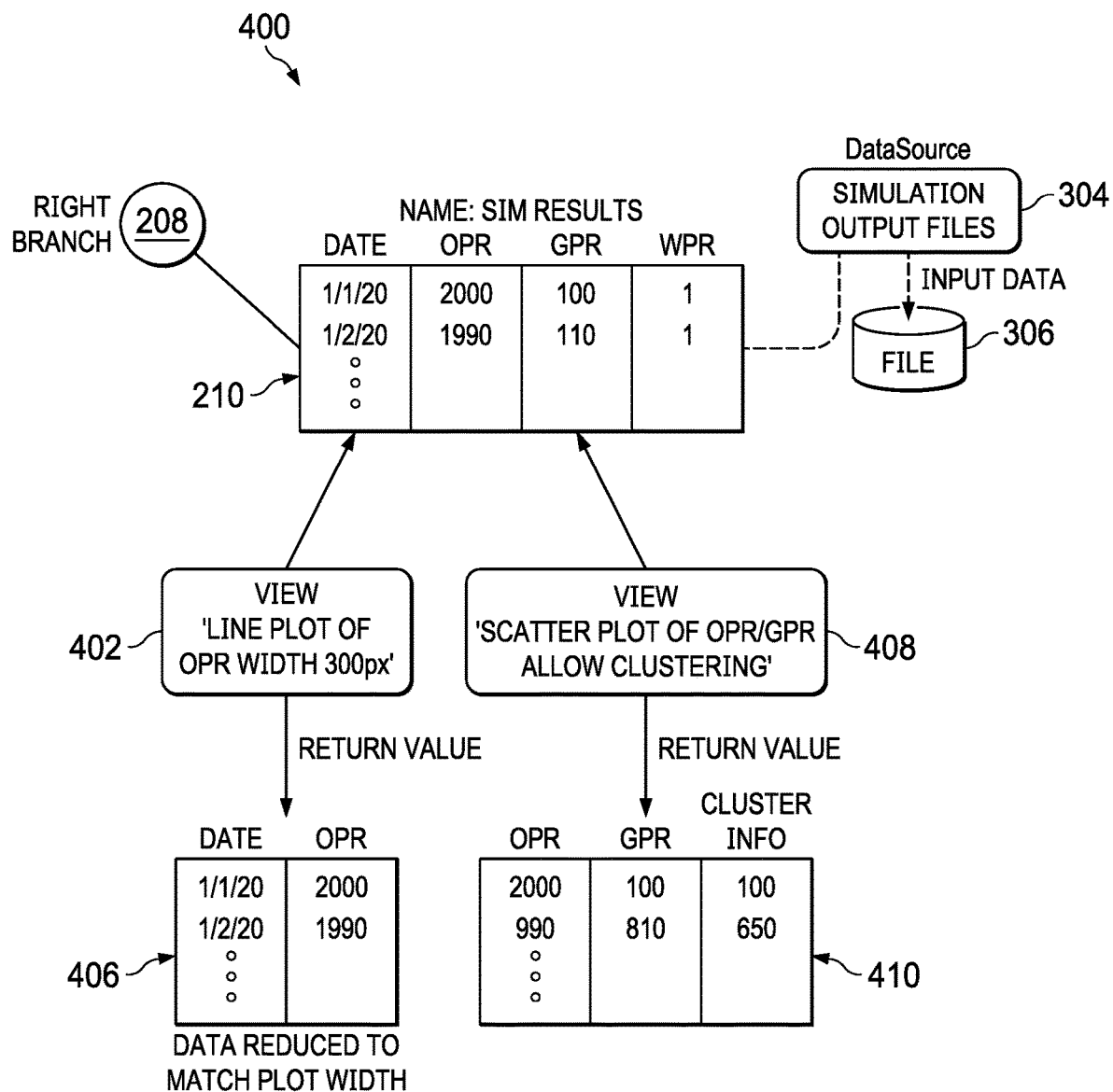
FIG. 4 is a graph-and-table diagram showing examples of two different data views on a same document, according to some implementations of the present disclosure.

FIG. 4 is a graph-and-table diagram 400 showing examples of two different data views on a same document, according to some implementations of the present disclosure. For example, data view 402 on a "Sim Results" table 210 of FIG. 4 may support a line plot using OPR over the whole date range and plot space width of 300 pixels. Return values 406, for example, are produced for this view. Further assume the document has 3,000,000 rows. Obviously, the plot space is far too small to plot all data points. As such, an appropriate strategy of the data source object would be to reduce the data size to match the given width. When zooming in, for example, the data source has to recalculate its output data set. Another view 408 on the same document (table 210) might be a scatter plot of "OPR" against "GPR". Return values 410, for example, are produced for this view. In this case, the data source may decide that it is best (for example, most efficient) to cluster the data values and recalculate again when zooming into the scatter plot. Another example for a data view (not shown in FIG. 4) is the view point and view frustum for 3D rendering.

Querying the Graph

As shown in FIGS. 2-4, only a generic graph structure with its different data sources has been described. This section covers querying the graph and how those queries are intermingled with data sources. Querying techniques can include the use of functional programming domain-specific-language (DSL) for graph queries, for example, by extending conventional techniques. With such a functional DSL, the graph query can be a concatenation of function calls. The function calls can work on sets of vertices, edges, or documents. For example, the Gremlin graph query language is developed for graph databases with key/value pairs as data. In the case of the present disclosure, data can be stored in relational fashion, creating a mixed graph/relational database. This new data layout makes it necessary to extend the functional query language to integrate relational queries as known from structured query language (SQL). Further-on filter and arithmetic operations have to be added, as well.

Data is stored in documents, and a vertex or edge can store many documents. As such, a new function document ('document name') is introduced. The function's return value is the set of all documents with the given name.

An inner join operation can be introduces that calculates the intersection of two document (table) sets based on an attribute specified as join key, such as using join ('input set 1', 'input set 2', join key). By using sets as input to the join operation (and not two tables as in a regular SQL query), the output set of the join function can be the cross product of both input sets. Every element (table) of the output sets itself is the intersection of two elements (tables) of the input sets, based on the 'join key'.

In a graph database storing data as key/value pairs, a filter operation can be used to select vertices, where key/value pairs match a certain criteria. The result will be a set of vertices. In the case of tabular data, a filter operation can use one or many columns as filter input and can create a new table with all rows that match the filter operation. The filter (['list of conditions']), for example, can take a set of tabular documents (including the return set of the previous function call and a list of filter conditions) as input and can produce, as output, a new set of those input documents, where each row matches the filter criteria.

Arithmetic operations are different from the other query language extensions. All arithmetic operations typically have to be implemented by the user. The query language construct serves as a unifying interface to be able to access arbitrary user implementations. As such, the query language construct is called by operation ('operation name', ['list of input sets'], ['list of parameters']) or operation ('operation name', ['list of parameters']). In this example, 'operation name' identifies the operation to be performed on the tabular documents. The operation is identified either by ['list of input sets'], in the case the operation is a non-unary operation, or in the case of a unary operation, the input set is the return set of the previous function call. In these examples, ['list of parameters'] is a set of key/value pairs describing the operation parameters.

If the results of the join, filter, or operation are added to the graph, then all those function calls are not evaluated immediately. Only the management structure is created and added to the graph. The evaluation is then inserted as a data source as described above and is only evaluated if data is requested.

Figure 5:
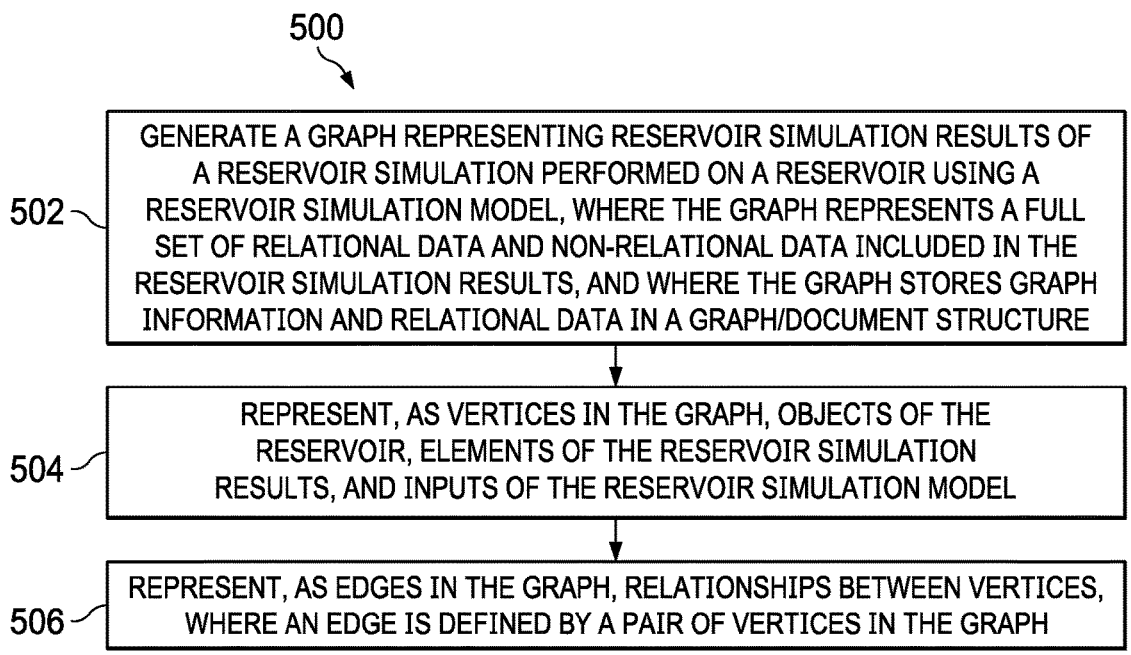
FIG. 5 is a flowchart of an example of a method for implementing a graph representing reservoir simulation results of a reservoir simulation, according to some implementations of the present disclosure.

FIG. 5 is a flowchart of an example of a method 500 for implementing a graph representing reservoir simulation results of a reservoir simulation, according to some implementations of the present disclosure. For clarity of presentation, the description that follows generally describes method 500 in the context of the other figures in this description. However, it will be understood that method 500 can be performed, for example, by any suitable system, environment, software, and hardware, or a combination of systems, environments, software, and hardware, as appropriate. In some implementations, various steps of method 500 can be run in parallel, in combination, in loops, or in any order.

At 502, a graph is generated that represents reservoir simulation results of a reservoir simulation performed on a reservoir using a reservoir simulation model. The graph represents a full set of relational data and non-relational data included in the reservoir simulation results. The graph stores graph information and relational data in a graph/document structure. In some implementations, data can be imported into a vertex of the graph from different data sources, and an operation can be performed using each data source. The operation can be, for example, a calculation or a filter and join query. The graph that is generated can include features as described with reference to FIGS. 1-4. From 502, method 500 proceeds to 504.

At 504, objects of the reservoir, elements of the reservoir simulation results, and inputs of the reservoir simulation model are represented as vertices in the graph. A vertex in the graph can represent an entity, such as a reservoir simulation, a field, an input model, a reservoir, a surface network, a grid, a group, a well, an event, a branch, devices, or a perforation. Example aspects of the vertices of the graph are described with reference to FIGS. 1-4. From 504, method 500 proceeds to 506.

At 506, relationships between vertices are represented as edges in the graph. An edge is defined by a pair of vertices in the graph. For example, the graph can include relationships as described with reference to FIGS. 1-4. After 506, method 500 can stop.

In some implementations, method 500 further includes steps for handling queries. For example, a query can be received that includes functional programming domain-specific-language (DSL) for graph queries. The received query can be executed on the graph/document structure of the graph, including on graph aspects of the graph/document structure and on documents in the graph/document structure.

Figure 6:
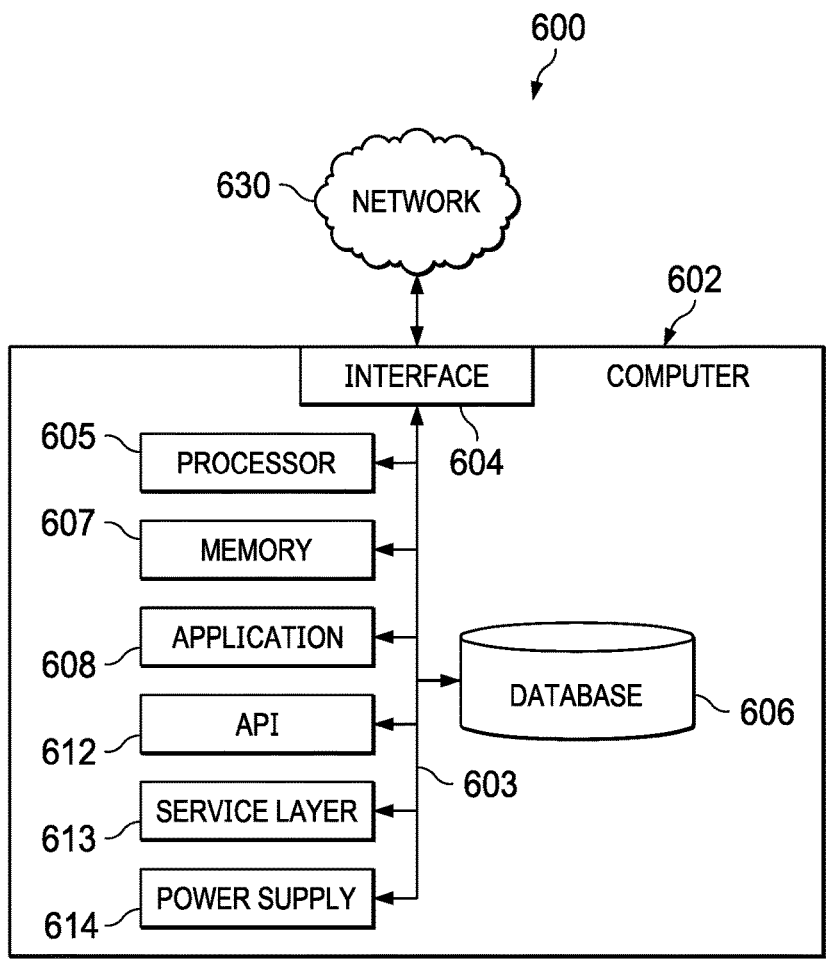
FIG. 6 is a block diagram illustrating an example computer system used to provide computational functionalities associated with described algorithms, methods, functions, processes, flows, and procedures as described in the present disclosure, according to some implementations of the present disclosure.

FIG. 6 is a block diagram of an example computer system 600 used to provide computational functionalities associated with described algorithms, methods, functions, processes, flows, and procedures described in the present disclosure, according to some implementations of the present disclosure. The illustrated computer 602 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 602 can include input devices such as keypads, keyboards, and touch screens that can accept user information. Also, the computer 602 can include output devices that can convey information associated with the operation of the computer 602. The information can include digital data, visual data, audio information, or a combination of information. The information can be presented in a graphical user interface (UI) (or GUI).

The computer 602 can serve in a role as a client, a network component, a server, a database, a persistency, or components of a computer system for performing the subject matter described in the present disclosure. The illustrated computer 602 is communicably coupled with a network 630. In some implementations, one or more components of the computer 602 can be configured to operate within different environments, including cloud-computing-based environments, local environments, global environments, and combinations of environments.

At a top level, the computer 602 is an electronic computing device operable to receive, transmit, process, store, and manage data and information associated with the described subject matter. According to some implementations, the computer 602 can also include, or be communicably coupled with, an application server, an email server, a web server, a caching server, a streaming data server, or a combination of servers.

The computer 602 can receive requests over network 630 from a client application (for example, executing on another computer 602). The computer 602 can respond to the received requests by processing the received requests using software applications. Requests can also be sent to the computer 602 from internal users (for example, from a command console), external (or third) parties, automated applications, entities, individuals, systems, and computers.

Each of the components of the computer 602 can communicate using a system bus 603. In some implementations, any or all of the components of the computer 602, including hardware or software components, can interface with each other or the interface 604 (or a combination of both) over the system bus 603. Interfaces can use an application programming interface (API) 612, a service layer 613, or a combination of the API 612 and service layer 613. The API 612 can include specifications for routines, data structures, and object classes. The API 612 can be either computer-language independent or dependent. The API 612 can refer to a complete interface, a single function, or a set of APIs.

The service layer 613 can provide software services to the computer 602 and other components (whether illustrated or not) that are communicably coupled to the computer 602. The functionality of the computer 602 can be accessible for all service consumers using this service layer. Software services, such as those provided by the service layer 613, can provide reusable, defined functionalities through a defined interface. For example, the interface can be software written in JAVA, C++, or a language providing data in extensible markup language (XML) format. While illustrated as an integrated component of the computer 602, in alternative implementations, the API 612 or the service layer 613 can be stand-alone components in relation to other components of the computer 602 and other components communicably coupled to the computer 602. Moreover, any or all parts of the API 612 or the service layer 613 can be implemented as child or sub-modules of another software module, enterprise application, or hardware module without departing from the scope of the present disclosure.

The computer 602 includes an interface 604. Although illustrated as a single interface 604 in FIG. 6, two or more interfaces 604 can be used according to particular needs, desires, or particular implementations of the computer 602 and the described functionality. The interface 604 can be used by the computer 602 for communicating with other systems that are connected to the network 630 (whether illustrated or not) in a distributed environment. Generally, the interface 604 can include, or be implemented using, logic encoded in software or hardware (or a combination of software and hardware) operable to communicate with the network 630. More specifically, the interface 604 can include software supporting one or more communication protocols associated with communications. As such, the network 630 or the interface's hardware can be operable to communicate physical signals within and outside of the illustrated computer 602.

The computer 602 includes a processor 605. Although illustrated as a single processor 605 in FIG. 6, two or more processors 605 can be used according to particular needs, desires, or particular implementations of the computer 602 and the described functionality. Generally, the processor 605 can execute instructions and can manipulate data to perform the operations of the computer 602, including operations using algorithms, methods, functions, processes, flows, and procedures as described in the present disclosure.

The computer 602 also includes a database 606 that can hold data for the computer 602 and other components connected to the network 630 (whether illustrated or not). For example, database 606 can be an in-memory, conventional, or a database storing data consistent with the present disclosure. In some implementations, database 606 can be a combination of two or more different database types (for example, hybrid in-memory and conventional databases) according to particular needs, desires, or particular implementations of the computer 602 and the described functionality. Although illustrated as a single database 606 in FIG. 6, two or more databases (of the same, different, or combination of types) can be used according to particular needs, desires, or particular implementations of the computer 602 and the described functionality. While database 606 is illustrated as an internal component of the computer 602, in alternative implementations, database 606 can be external to the computer 602.

The computer 602 also includes a memory 607 that can hold data for the computer 602 or a combination of components connected to the network 630 (whether illustrated or not). Memory 607 can store any data consistent with the present disclosure. In some implementations, memory 607 can be a combination of two or more different types of memory (for example, a combination of semiconductor and magnetic storage) according to particular needs, desires, or particular implementations of the computer 602 and the described functionality. Although illustrated as a single memory 607 in FIG. 6, two or more memories 607 (of the same, different, or combination of types) can be used according to particular needs, desires, or particular implementations of the computer 602 and the described functionality. While memory 607 is illustrated as an internal component of the computer 602, in alternative implementations, memory 607 can be external to the computer 602.

The application 608 can be an algorithmic software engine providing functionality according to particular needs, desires, or particular implementations of the computer 602 and the described functionality. For example, application 608 can serve as one or more components, modules, or applications. Further, although illustrated as a single application 608, the application 608 can be implemented as multiple applications 608 on the computer 602. In addition, although illustrated as internal to the computer 602, in alternative implementations, the application 608 can be external to the computer 602.

The computer 602 can also include a power supply 614. The power supply 614 can include a rechargeable or non-rechargeable battery that can be configured to be either user- or non-user-replaceable. In some implementations, the power supply 614 can include power-conversion and management circuits, including recharging, standby, and power management functionalities. In some implementations, the power-supply 614 can include a power plug to allow the computer 602 to be plugged into a wall socket or a power source to, for example, power the computer 602 or recharge a rechargeable battery.

There can be any number of computers 602 associated with, or external to, a computer system containing computer 602, with each computer 602 communicating over network 630. Further, the terms "client," "user," and other appropriate terminology can be used interchangeably, as appropriate, without departing from the scope of the present disclosure. Moreover, the present disclosure contemplates that many users can use one computer 602 and one user can use multiple computers 602.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory.

Graphics processing units (GPUs) can also be used in combination with CPUs. The GPUs can provide specialized processing that occurs in parallel to processing performed by CPUs. The specialized processing can include artificial intelligence (AI) applications and processing, for example. GPUs can be used in GPU clusters or in multi-GPU computing.

A computer can include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/–R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method, comprising:
   storing a multi-relational graph of vertices and edges representing, as the vertices of the multi-relational graph, reservoir simulation inputs, objects, outputs, and reservoir simulation results of a reservoir simulation performed on a reservoir using a reservoir simulation model, wherein the multi-relational graph represents a full set of relational data and non-relational data included in the reservoir simulation results, and wherein the multi-relational graph stores graph information and relational data in a graph/document structure;
   storing, as vertices in the multi-relational graph, objects of the reservoir, elements of the reservoir simulation results, and inputs of the reservoir simulation model; and
   storing, as edges in the multi-relational graph, relationships between vertices, wherein an edge is defined by a pair of vertices in the multi-relational graph, wherein each edge comprises a label defining a dynamic relationship between two vertices connected by a respective edge, the dynamic relationship between two vertices varying relative to a total number of vertices in the multi-relational graph, wherein the dynamic relationship between two vertices changes over time as new vertices are added to the reservoir simulation wherein each edge defines a ternary relationship comprising an operation allowing an edge to have a plurality of time values, wherein the multi-relational graph is a graph G of vertices V and edges E defined as G=(V, E), wherein each edge E=(i, j) is an edge connecting vertices i and j with i, j∈V, wherein each E⊆(V×V), wherein each E⊆(V×Ω×V), with Ω describing the set of edge labels, wherein E⊆(V×Ω×T*×V), wherein T∈{t|$t_{start}$≤t≤$t_{end}$} in which $t_{start}$ and $t_{end}$ are simulation begin and end dates, respectively.

2. The computer-implemented method of claim 1, wherein a vertex in the multi-relational graph can represent an entity selected from a group comprising a reservoir simulation, a field, an input model, a reservoir, a surface network, a grid, a group, a well, an event, a branch, one or more devices, and a perforation.

3. The computer-implemented method of claim 1, further comprising:
   importing data into a vertex of the multi-relational graph from different data sources; and
   performing, using each data source, an operation selected from a group comprising a calculation and a filter and join query.

4. The computer-implemented method of claim 3, wherein the data source decides to load data into the multi-relational graph in total or on demand.

5. The computer-implemented method of claim 3, wherein the data source is a file or a database.

6. The computer-implemented method of claim 3, wherein one or more data sources form a call graph for the vertex of the multi-relational graph.

7. The computer-implemented method of claim 1, further comprising:
   receiving a query that includes functional programming domain-specific-language (DSL) for graph queries; and
   executing the query on the graph/document structure of the multi-relational graph, including graph aspects of the graph/document structure and on documents in the graph/document structure.

8. A computer-implemented system, comprising:
   a graph/document structure configured to store graph information and relational data in a multi-relational graph of vertices and edges, wherein the multi-relational graph represents, using the vertices of the multi-relational graph, reservoir simulation inputs, objects, outputs, and reservoir simulation results of a reservoir simulation performed on a reservoir using a reservoir simulation model, and wherein the multi-relational graph represents a full set of the relational data and non-relational data included in the reservoir simulation results;
   one or more processors; and
   a non-transitory computer-readable storage medium coupled to the one or more processors and storing programming instructions for execution by the one or more processors, the programming instructions instructing the one or more processors to perform operations comprising:
   storing the multi-relational graph from the reservoir simulation results, including generating the relational data and non-relational data in the graph/document structure;
   storing, as vertices in the multi-relational graph, objects of the reservoir, elements of the reservoir simulation results, and inputs of the reservoir simulation model; and
   storing, as edges in the multi-relational graph, relationships between vertices, wherein an edge is defined by a pair of vertices in the multi-relational graph, wherein each edge comprises a label defining a dynamic relationship between two vertices connected by a respective edge, the dynamic relationship between two vertices varying relative to a total number of vertices in the multi-relational graph, wherein the dynamic relationship between two vertices changes over time as new vertices are added to the reservoir simulation wherein each edge defines a ternary relationship comprising an operation allowing an edge to have a plurality of time values, wherein the multi-relational graph is a graph G of vertices V and edges E defined as G=(V, E), wherein each edge E=(i, j) is an edge connecting vertices i and j with i, j∈V, wherein each E⊆(V×V), wherein each E⊆(V×Ω×V), with Ω describing the set of edge labels, wherein E⊆(V×Ω×T*×V), wherein T∈{t|$t_{start}$≤t≤$t_{end}$} in which $t_{start}$ and $t_{end}$ are simulation begin and end dates, respectively.

9. The computer-implemented system of claim 8, wherein a vertex in the multi-relational graph can represent an entity selected from a group comprising a reservoir simulation, a field, an input model, a reservoir, a surface network, a grid, a group, a well, an event, a branch, one or more devices, and a perforation.

10. The computer-implemented system of claim 8, the operations further comprising:
    importing data into a vertex of the multi-relational graph from different data sources; and
    performing, using each data source, an operation selected from a group comprising a calculation and a filter and join query.

11. The computer-implemented system of claim 10, wherein the data source decides to load data into the multi-relational graph in total or on demand.

12. The computer-implemented system of claim 10, wherein the data source is a file or a database.

13. The computer-implemented system of claim 10, wherein one or more data sources form a call graph for the vertex of the multi-relational graph.

14. The computer-implemented system of claim 8, the operations further comprising:
    receiving a query that includes functional programming domain-specific-language (DSL) for graph queries; and
    executing the query on the graph/document structure of the multi-relational graph, including graph aspects of the graph/document structure and on documents in the graph/document structure.

15. A non-transitory, computer-readable medium storing one or more instructions executable by a computer system to perform operations comprising:
    storing a multi-relational graph of vertices and edges representing, as the vertices of the multi-relational graph, reservoir simulation inputs, objects, outputs, and reservoir simulation results of a reservoir simulation performed on a reservoir using a reservoir simulation model, wherein the multi-relational graph represents a full set of relational data and non-relational data included in the reservoir simulation results, and wherein the multi-relational graph stores graph information and relational data in a graph/document structure;

storing, as vertices in the multi-relational graph, objects of the reservoir, elements of the reservoir simulation results, and inputs of the reservoir simulation model; and storing, as edges in the multi-relational graph, relationships between vertices, wherein an edge is defined by a pair of vertices in the multi-relational graph, wherein each edge comprises a label defining a dynamic relationship between two vertices connected by a respective edge, the dynamic relationship between two vertices varying relative to a total number of vertices in the multi-relational graph, wherein the dynamic relationship between two vertices changes over time as new vertices are added to the reservoir simulation wherein each edge defines a ternary relationship comprising an operation allowing an edge to have a plurality of time values, wherein the multi-relational graph is a graph G of vertices V and edges E defined as G=(V, E), wherein each edge E=(i, j) is an edge connecting vertices i and j with i, j∈V, wherein each E⊆(V×V), wherein each E⊆(V×Ω×V), with Ω describing the set of edge labels, wherein E⊆(V×Ω×T*×V), wherein T∈{t|$t_{start}$≤t≤$t_{end}$} in which $t_{start}$ and $t_{end}$ are simulation begin and end dates, respectively.

16. The non-transitory, computer-readable medium of claim 15, wherein a vertex in the multi-relational graph can represent an entity selected from a group comprising a reservoir simulation, a field, an input model, a reservoir, a surface network, a grid, a group, a well, an event, a branch, one or more devices, and a perforation.

17. The non-transitory, computer-readable medium of claim 15, the operations further comprising:
importing data into a vertex of the multi-relational graph from different data sources; and
performing, using each data source, an operation selected from a group comprising a calculation and a filter and join query.

18. The non-transitory, computer-readable medium of claim 17,
wherein the data source decides to load data into the multi-relational graph in total or on demand.

19. The non-transitory, computer-readable medium of claim 17, wherein the data source is a file or a database.

20. The non-transitory, computer-readable medium of claim 17, wherein one or more data sources form a call graph for the vertex of the multi-relational graph.

21. The computer-implemented method of claim 1, wherein the dynamic relationship between two vertices is selected from a group of a set of edge labels comprising is_grid, is_network, in_group, is_input, is_well, in_well, is_group, is_res (reservoir), nested_branch, is_perf (perforation), and is_specific_event.

22. The computer-implemented system of claim 8, wherein the dynamic relationship between two vertices is selected from a group of a set of edge labels comprising is_grid, is_network, in_group, is_input, is_well, in_well, is_group, is_res (reservoir), nested_branch, is_perf (perforation), and is_specific_event.

23. The non-transitory, computer-readable medium of claim 15, wherein the dynamic relationship between two vertices is selected from a group of a set of edge labels comprising is_grid, is_network, in_group, is_input, is_well, in_well, is_group, is_res (reservoir), nested_branch, is_perf (perforation), and is_specific_event.

* * * * *